United States Patent [19]
Choi et al.

[11] Patent Number: 5,502,412
[45] Date of Patent: Mar. 26, 1996

[54] METHOD AND CIRCUIT FOR DRIVING POWER TRANSISTORS IN A HALF BRIDGE CONFIGURATION FROM CONTROL SIGNALS REFERENCED TO ANY POTENTIAL BETWEEN THE LINE VOLTAGE AND THE LINE VOLTAGE RETURN AND INTEGRATED CIRCUIT INCORPORATING THE CIRCUIT

[75] Inventors: Chongwook C. Choi; David C. Tam, both of Redondo Beach, Calif.

[73] Assignee: International Rectifier Corporation, El Segundo, Calif.

[21] Appl. No.: 433,841

[22] Filed: May 4, 1995

[51] Int. Cl.[6] ................................................ H03K 19/0175
[52] U.S. Cl. .......................... 327/333; 327/112; 327/427
[58] Field of Search ..................................... 327/333, 112, 327/427

[56] References Cited

U.S. PATENT DOCUMENTS

| | | | |
|---|---|---|---|
| 4,767,946 | 8/1988 | Taylor | 327/333 |
| 4,791,312 | 12/1988 | Weick | 327/333 |
| 4,792,704 | 12/1988 | Lobb et al. | 327/333 |
| 5,414,314 | 5/1995 | Thurber | 327/333 |
| 5,440,258 | 8/1995 | Galbi et al. | 327/112 |

*Primary Examiner*—John S. Heyman
*Attorney, Agent, or Firm*—Ostrolenk, Faber, Gerb & Soffen

[57] ABSTRACT

A circuit for driving power transistors in a half bridge configuration from a control signal referenced to any potential between the line voltage for the power transistors and the line voltage return. The circuit includes an input circuit receiving a control signal referenced to any potential between the line voltage and the line voltage return, the input circuit being supplied with two voltage levels floating with respect to a common voltage level, a first level shifting circuit receiving an output of the input circuit which shifts the level of the output of the input circuit so that it is referenced to the common voltage level, a low side driver circuit for the power transistor in the half bridge configuration which functions as the low side power transistor, the low side driver circuit receiving the output referenced to the common voltage level, a second level shifting circuit which shifts the level of the output from the first level shifting circuit to produce a signal referenced to a second higher voltage level than said common level, and a driver circuit receiving the signal referenced to the second higher voltage level for driving the power transistor comprising the high side power transistor in the half bridge configuration. The circuit can be incorporated in an integrated circuit comprising a single chip, i.e., a silicon chip.

10 Claims, 4 Drawing Sheets

METHOD AND CIRCUIT FOR DRIVING POWER TRANSISTORS IN A HALF BRIDGE CONFIGURATION FROM CONTROL SIGNALS REFERENCED TO ANY POTENTIAL BETWEEN THE LINE VOLTAGE AND THE LINE VOLTAGE RETURN AND INTEGRATED CIRCUIT INCORPORATING THE CIRCUIT

BACKGROUND OF THE INVENTION

This invention relates to a method and circuit for driving power transistors in a half bridge configuration from control signals referenced to any potential between the line voltage and the line voltage return. For example, the present invention is applicable to power MOSFETS arranged in a half bridge configuration. It is equally applicable to other types of transistors. The invention also relates to an integrated circuit driver chip incorporating the circuit.

There is a need for an interface circuit between power transistors in a half bridge configuration and the control signals for the power transistors. There is especially a need for such an interface circuit which can couple the power transistors to control signals referenced to any potential between the voltage supply line for the power transistors and the return. There is furthermore a need for such a circuit which can be integrated in a single driver chip with other driver functions.

In the prior art, the most common cases are where the control signals are referenced to the return, to the line voltage or to a mid point between the line voltage $V_L$ and the return $-V_L$. FIG. 1 of this application shows an example where the control signals are referenced to the mid point between the line $V_L$ and return $-V_L$. In this case the mid point between the line and return is ground or $V_{ss}$. In the circuit of FIG. 1, all control signals must be referenced to ground or $V_{ss}$.

It would be advantageous if a circuit could be provided wherein the control signals could be referenced to any potential between $+V_L$ and $-V_L$.

SUMMARY OF THE INVENTION

It is an object of the present invention to provide a method and circuit for driving power transistors in a half bridge configuration from control signals referenced to any potential between the line voltage and the line return.

It is furthermore an object of the present invention to provide an integrated circuit driver chip incorporating the driver circuit.

The above and other objects are achieved by a method for driving power transistors in a half bridge configuration from a control signal referenced to any potential between the line voltage for the power transistors and the line voltage return, comprising providing a control signal referenced to any potential between the line voltage and the line voltage return to an input circuit; providing said input circuit with two voltage levels floating with respect to a common voltage level; providing an output of said input circuit to a first level shifting circuit which shifts the level of the output of the input circuit so that it is referenced to the common voltage level; providing said output referenced to the common voltage level to a low side driver circuit for the power transistor in said half bridge configuration which functions as a low side power transistor; providing said output referenced to said common voltage level also to a second level shifting circuit which shifts the level of said output from said first level shifting circuit to produce a signal referenced to a second higher voltage level than said common level; and providing said signal referenced to said second higher voltage level to a high side driver circuit for driving the power transistor comprising the high side power transistor in said half bridge configuration.

The above and other objects of the invention are also achieved by a circuit for driving power transistors in a half bridge configuration from a control signal referenced to any potential between the line voltage for the power transistors and the line voltage return, comprising an input circuit receiving a control signal referenced to any potential between the line voltage and the line voltage return, said input circuit being supplied with two voltage levels floating with respect to a common voltage level; a first level shifting circuit receiving an output of said input circuit which shifts the level of the output of the input circuit so that it is referenced to the common voltage level; a low side driver circuit for the power transistor in said half bridge configuration which functions as the low side power transistor, said low side driver circuit receiving said output referenced to the common voltage level; a second level shifting circuit which shifts the level of said output from said first level shifting circuit to produce a signal referenced to a second higher voltage level reference than said common level; and a driver circuit receiving the signal referenced to said second higher voltage level for driving the power transistor comprising the high side power transistor in said half bridge configuration.

The above and other objects of the invention are also achieved by a method of integrating on a single integrated circuit chip a circuit for driving power transistors in a half bridge configuration from a control signal referenced to any potential between the line voltage for the power transistors and the line voltage return, comprising: providing a control signal referenced to any potential between the line voltage and the line voltage return to an input circuit; providing said input circuit with two voltage levels floating with respect to a common voltage level; providing an output of said input circuit to a first level shifting circuit which shifts the level of the output of the input circuit so that it is referenced to the common voltage level; providing said output referenced to the common voltage level to a low side driver circuit for the power transistor in said half bridge configuration which functions as a low side power transistor; providing said output referenced to said common voltage level also to a second level shifting circuit which shifts the level of said output from said first level shifting circuit to produce a signal referenced to a second higher voltage level than said common level; and providing the signal referenced to said second higher voltage level to a high side driver circuit for driving the power transistor comprising the high side power transistor in said half bridge configuration.

The objects of the invention are furthermore achieved by a circuit integrated on a single integrated circuit chip for driving power transistors in a half bridge configuration from a control signal referenced to any potential between the line voltage for the power transistors and the line voltage return, comprising:

an input circuit receiving a control signal referenced to any potential between the line voltage and the line voltage return, said input circuit being supplied with two voltage levels floating with respect to a common voltage level;

a first level shifting circuit receiving an output of said input circuit which shifts the level of the output of the input circuit so that it is referenced to the common voltage level;

a low side driver circuit for the power transistor in said half bridge configuration which functions as the low side power transistor, said low side driver circuit receiving said output referenced to the common voltage level;

a second level shifting circuit which shifts the level of said output from said first level shifting circuit to produce a signal referenced to a second higher voltage level than said common level; and a driver circuit receiving the signal referenced to said second higher voltage level for driving the power transistor comprising the high side power transistor in said half bridge configuration.

BRIEF DESCRIPTION OF THE DRAWINGS

The invention will be described in greater detail in the following detailed description with reference to the drawings in which.

DETAILED DESCRIPTION

Figure 1:
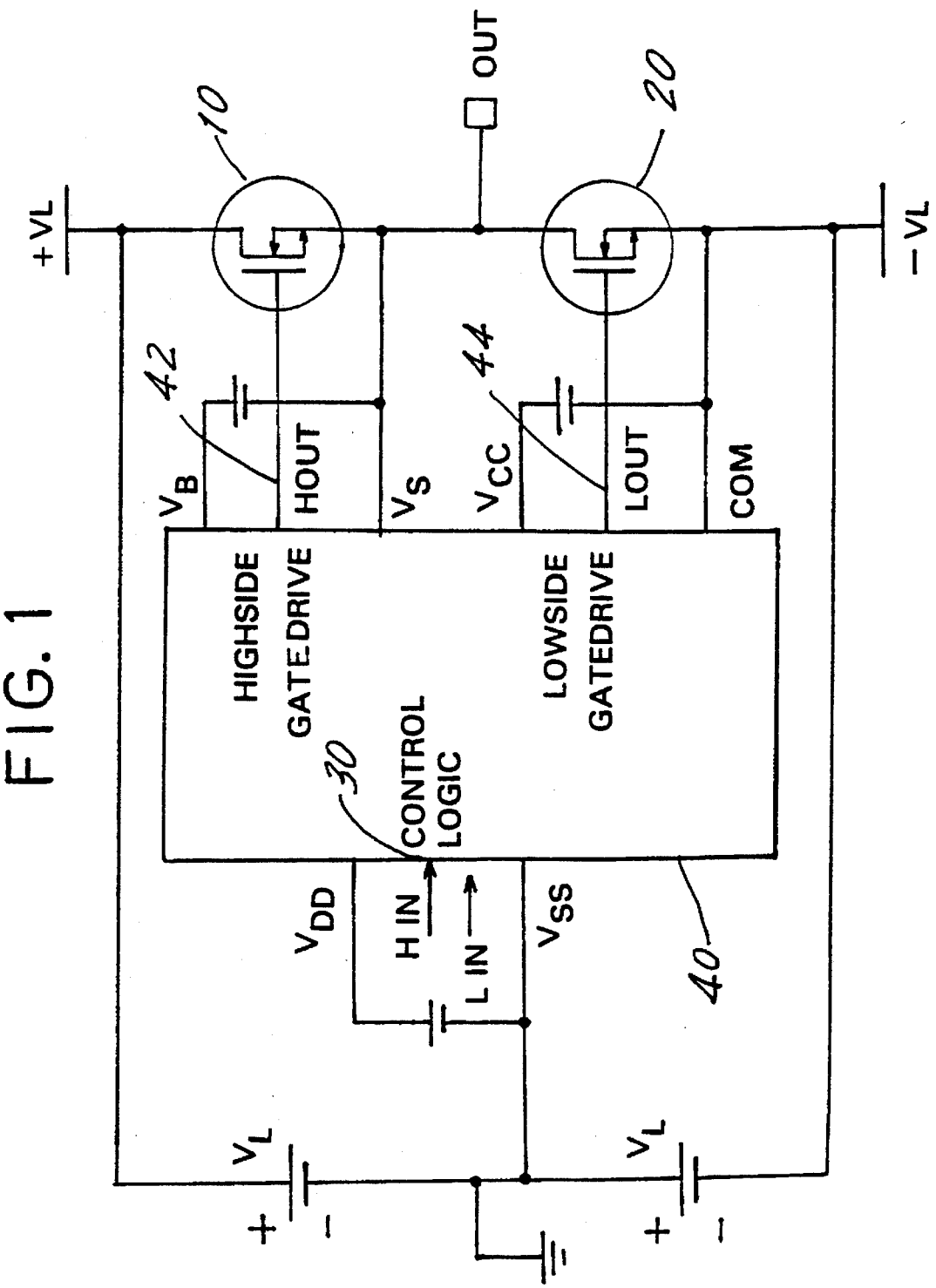
FIG. 1 shows an example of the connection of an interface circuit between control signals and two power transistors arranged in a half bridge configuration.

With reference now to the drawing figures, FIG. 1 shows a generalized circuit diagram for an interface between control signals for driving power transistors and power transistors arranged in a half bridge configuration. In the embodiment shown, the power transistors operate, as known to those of skill in the art, in complementary fashion, with the load connected to the terminal OUT. The half bridge circuit includes a high side power transistor 10 and a low side power transistor 20. In the circuit shown, when the high side power transistor is driven on, the low side power transistor is off. Conversely, when the low side power transistor is on, the high side transistor is off. Half bridge circuits can also be configured to operate so that the load is in series with both transistors, in which case the two transistors may be driven on simultaneously.

The control signals, e.g. HIN and LIN, are provided at inputs 30 to a control logic interface circuit 40. Control logic circuits from the prior art are known to those of skill in the art. For example, such a control logic circuit may be a type IR 2110, available from International Rectifier Corp., the assignee of this application. There may be one or more control inputs 30, depending on how the circuit is controlled, as known to those of skill in the art. In FIG. 1, two control inputs are shown.

The control logic interface circuit 40 provides a high side gate drive 42 and a low side gate drive 44, as known to those of skill in the art. Voltage sources $V_B$, $V_{CC}$ and $V_{DD}$ are coupled to the control logic, as known to those of skill in the art. Additionally, sources $V_L$ and $-V_L$ are coupled to main terminals of the respective power transistors 10 and 20. The power transistors have a common point coupled to $V_s$ and to which the load is connected. In the embodiment shown, ground is connected to the voltage level $v_{ss}$.

In the prior art, as shown in FIG. 1, the control signal or signals 30 have been referenced to a reference level, typically ground. Many inverter control signals, however, need not be referenced to ground. It is desirable to provide an interface circuit between the control signals and the power transistors which allows the control signals to be referenced to any potential between the line and its return i.e., between $+V_L$ and $-V_L$.

Figure 3:
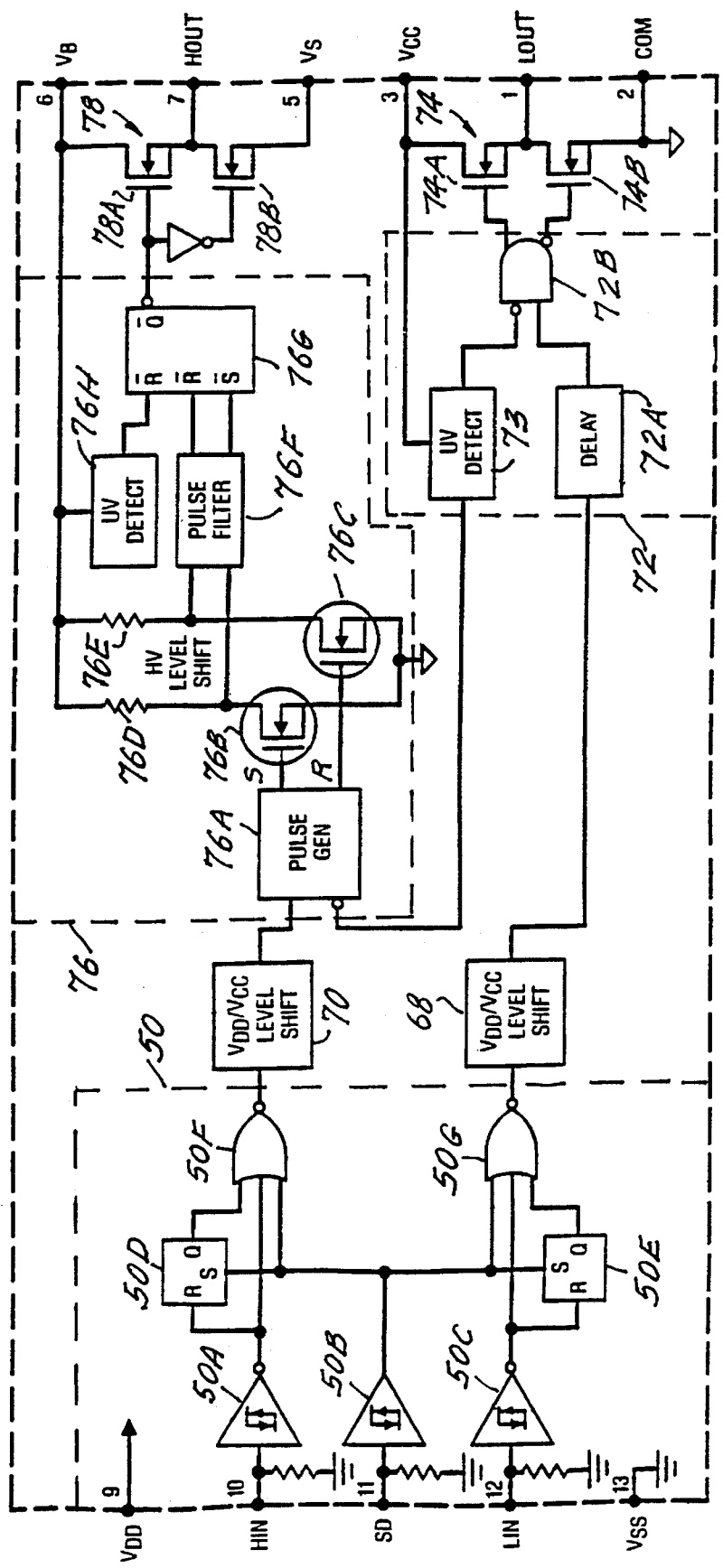
FIG. 3 shows a known driver circuit in which the control signals are referenced to ground and which can be modified in accordance with the invention.

FIG. 3 shows details of the conventional device of FIG. 1, in particular, an IR 2110 driver circuit, in which the control input signals are referenced to $V_{ss}$ (ground).

FIG. 3 is a functional block diagram of the circuit contained within the integrated circuit 40 of FIG. 1. Logic input pins 10, 11 and 12 are connected through Schmitt triggers 50A, 50B and 50C to the RS latches 50D and 50E and also to logic circuits 50F and 50G, as shown. The outputs of logic circuits 50F and 50G are coupled, respectively, to level shift circuits 70 and 68. As will be seen, the outputs of the level shift circuits 70 and 68 control the high side control output and low side control output at pins 7 (HOUT) and 1 (LOUT), respectively.

The output from level shift circuit 68 in the low voltage channel is applied through a delay circuit 72A and one input of gate circuit 72B. The output of gate 72B is connected to the gate electrodes of output driver MOSFET transistors 74A and 74B. As will be later described, these transistors will produce a gate voltage at pin 1 when required by the logic input to pins 11 and 12.

FIG. 3 also contains an under-voltage detection circuit 73 which disables the output from gate 72B when an under-voltage is detected at pin 3 to prevent turn-on of the power MOSFET or IGBT operated from pin 1.

The level shift circuit 70 for the high voltage channel of the circuit has one input connected to a pulse generator 76A. Under-voltage detection circuit 73 is also connected to pulse generator 76A and will turn off the high voltage output channel responsive to the detection of an under-voltage condition at pin 3.

Pulse generator 76A has two outputs, a set (S) output connected to the gate of MOSFET 76B and a reset output (R) connected to the gate of MOSFET 76C. The set pulses are applied to MOSFET 76B and the reset pulses are applied to MOSFET 76C.

The sources of MOSFETs 76B and 76C are connected to a common connection rail and their drains are connected to resistors 76D and 76F, respectively.

During normal operation, the application of pulses to MOSFETs 76B and 76D from the pulse generator 76A will produce output voltage pulses Vset and Vrst at the nodes between MOSFETs 76B and 76C and their respective resistors 76D and 76E.

The pulses Vset and Vrst are then applied to a pulse filter 76F. The output channels of filter 76F are connected to the R and S inputs of a latch 76G. A second under-voltage detection circuit 76H is provided as an input to the latch 76G to ensure that no signal is applied at pin 7 if an under-voltage is detected at pin 6.

The output of the RS latch 76G is used to turn MOSFETs 78A and 78B on and off. Thus, if a high signal is applied to input R of the RS latch, the output at pin 7 is turned off. If a high signal is applied to the S input of latch 94, the output at pin 7 will turn on.

Figure 2:
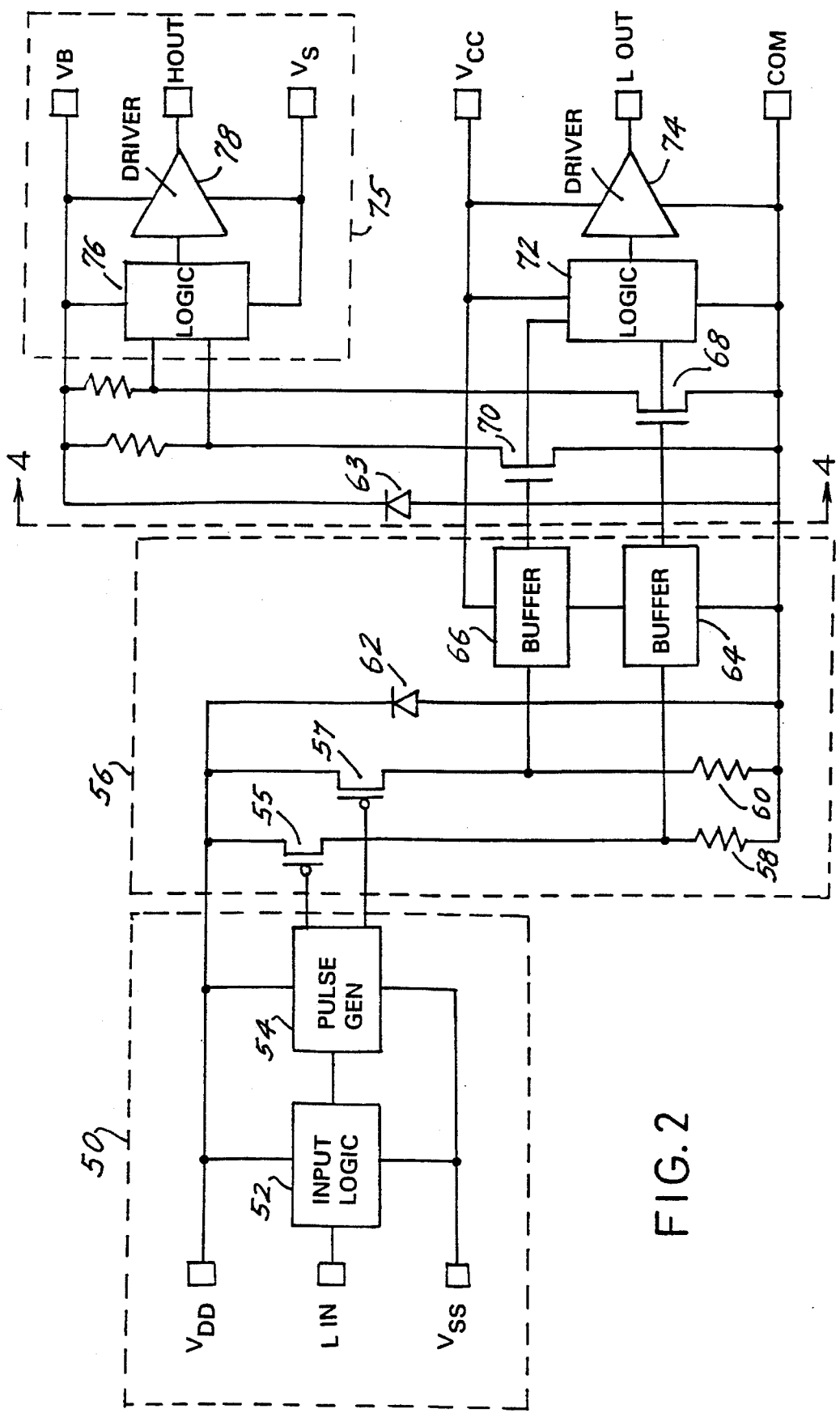
FIG. 2 shows the circuit of the invention providing the interface between the control signals and the power transistors and which allows the power transistors to be driven by control signals referenced to any potential between the line voltage and the return.

In the circuit of FIG. 3, the input control signals HIN and LIN are referenced to ground (VSS). It is desirable to provide a driver circuit like that of FIG. 3 in which the control signals can be referenced to any level between $+V_L$ and $-V_L$. The circuit according to FIG. 2, which replaces the control logic interface circuit 40 of FIG. 1, provides such an ability. With reference to FIG. 2, the interface circuit includes an input section 50 which receives the input control signals and is coupled to voltage sources $V_{DD}$ and $V_{ss}$. As shown, the line $V_{ss}$ is not coupled to ground, as in FIG. 1. $V_{DD}$ and $V_{ss}$ are chosen so as to allow the input circuit 52 to be responsive to a control signal having any reference between $+V_L$ and $-V_L$. The input signals are received by the input logic circuit 52, which itself is of conventional design, the output of which is coupled to a pulse generator 54, also of conventional design. As known to those of skill in the art, pulse generator 54 provides "on" and "off" outputs on the two respective output lines. An "on" pulse is provided at the leading edge of the input control signal and an "off" pulse at the trailing edge of the input control signal. Examples of logic circuit 52 and pulse generator 54 are shown by the boxed area 50 in FIG. 3.

The outputs of the pulse generator are provided to a first level shifting circuit 56, which comprises two P channel FETS 55 and 57, each coupled to a respective tie down resistor 58 or 60. An intrinsic or parasitic diode 62 is coupled across the resistor-transistor series circuits comprising the transistor 55 and resistor 58 and transistor 57 and resistor 60. Transistor 55 and transistor 57 level shift the control signals down to signals referenced to COM or $-V_L$. Thus, these signals provide the drive for the low side power device 20. This level shift circuit should be contrasted to the level shift circuits 70 and 68 of the prior art driver device of FIG. 3, which shift the level of the control signals from reference levels VDD and VSS to levels referenced to VCC and COM.

The outputs of each of transistors 55 and 57 are coupled to respective buffers 64 and 66. The outputs of the buffers 64 and 66 are coupled to respective N channel FETS 68 and 70 as well as to an output logic circuit 72 which is of conventional design, and is shown at 72 in FIG. 3. The output of the logic circuit 72 is provided to a driver circuit 74, also of conventional design (see FIG. 3), which provides the low side output drive signal to the low side power transistor.

Transistors 68 and 70 provide a second level shifting circuit, whereby the outputs of buffers 64 and 66 are level shifted to the higher voltage reference necessary for the high side power transistor 10 drive circuits 76 and 78, which are referenced to $V_B$ and $V_S$. Transistors 68 and 70 shift the reference level of the control signals at their gates from the COM reference level to the $V_B$ reference level necessary for the drive of the high side power device 10. The output of the logic circuit 76 is provided to a driver 78 of conventional design (see FIG. 3) which provides the high side output signal to the power transistor 10.

As shown, each of transistors 68 and 70 is coupled to a respective pull-up resistor 69 or 71 to accomplish the level shifting.

Also coupled across the second level shifting circuit is another intrinsic diode 63. The two N-channel FETs, the two P-channel FETs and the two diodes must be able to withstand at least a potential twice $V_L$. The two diodes represent the fact that the circuit blocks 50 and 75 can both float above $-V_L$ by more than twice $V_L$ independent of each other.

The part of the circuit to the right of the line denoted X—X is conventionally present in the IR type 2110 device. Accordingly, the entire circuit shown in FIG. 2, including the first level shifting circuit 56, preferably is integrated on a single integrated circuit chip, i.e., a single silicon chip. For example, the circuit of FIG. 2 represents an improvement to the IR 2110 device and can be incorporated on the single silicon chip of that device.

Figure 4:
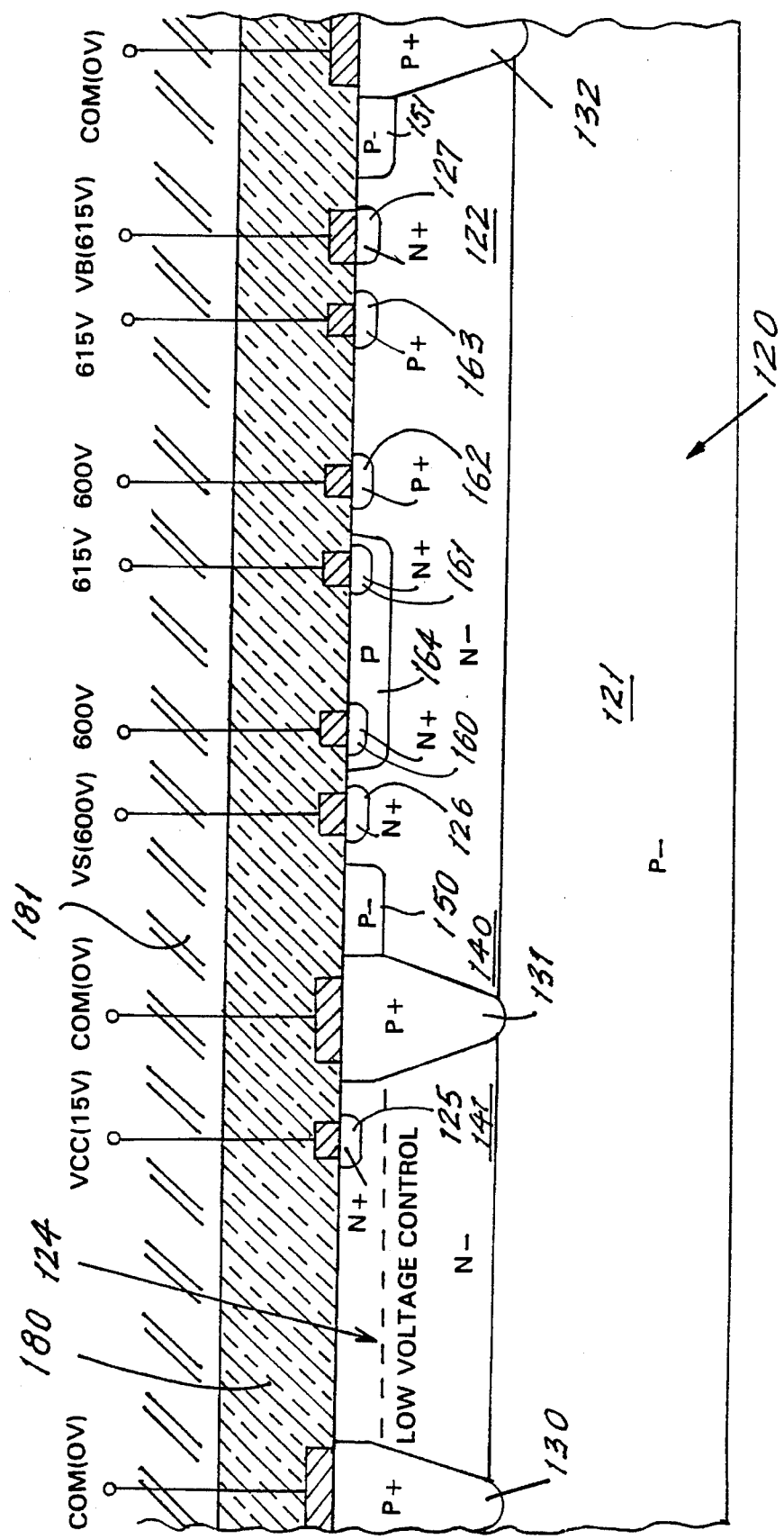
FIG. 4 shows how a portion of the circuit of FIG. 2 can be implemented in an integrated circuit.

FIG. 4 shows how a portion of the circuit of FIG. 2 can be implemented in an integrated circuit. When implementing the circuit of FIG. 2 in a common chip, the high and low voltage circuits are laterally isolated from one another. FIG. 4 shows a portion of such a chip in cross section, in particular, the circuit coupled between $V_B$ and $V_s$, circuit 75 of FIG. 2. Thus, in FIG. 4, a silicon chip 120 consists of a P(–) substrate 121 which has an epitaxial layer 122 of N(–) silicon grown thereon. The N(–) region 122 is separated into high voltage and low voltage regions by P+ sinkers 130, 131, and 132. Thus, sinkers 130 and 131 define a high voltage device region 140 in epitaxial layer 122, separated from low voltage region 141. Regions 140 and 141 can have any desired topology. Moreover, any desired isolation technique can be used between regions 140 and 141.

Typically, the driver circuit 78 of FIG. 2 comprises P channel and N channel MOSFETS. This is described in detail in copending application Ser. No. 08/274,012 filed Jul. 12, 1994 (IR-1131), the disclosure of which is incorporated by reference herein. Also described therein, and known to those of skill in the art, is the low voltage control circuit for the high voltage circuit, which may comprise P channel and N channel MOSFETS.

The high voltage circuitry of these MOSFETs is shown in FIG. 4 as formed within high voltage region 140. The P+ contact regions 162 and 163, which are diffused in layer 122, represent any of the source and drains of the P-channel MOSFETs of the driver 78 of FIG. 2. The P region 164 is diffused in layer 122 to form the P-type well region. The N+ contact regions 160 and 161, which are diffused in the P-type region 164, represent any of the sources and drains of the N channel MOSFETs of the driver 78 of FIG. 2.

The low voltage control circuitry MOSFETs are schematically shown as formed within area 141 in FIG. 4. N+ contact region 125 is diffused in region 141 and receives an electrode which is at the low voltage supply $V_{cc}$. The low voltage control region 124 would also contain diffusions, not shown, identical to the diffusions 160 to 164 in the high voltage region 140. However, all the N+ and P+ diffusions in the low voltage control region 124 would receive electrodes which are between $V_{cc}$ (15 V) and 0 V and these would represent the sources and drains of the MOSFETs of the low voltage control circuit.

N+ contact regions 126 and 127 are diffused into layer 122 and receive metallic electrodes which can be at potentials between $V_B$ (615 V) and $V_s$ (600 v). The P+ sinkers 130, 131, and 132 receive electrodes which are at zero or ground potential (COM). P(–) resurf regions 150 and 151 may encircle the high voltage region 40 to provide isolation from low voltage region 141.

As is conventional, all devices within the silicon surfaces are overcoated by a dielectric, for example, a low temperature silicon dioxide (silox) layer 180 which may have a thickness of about 1.5 micrometers. Contacts to all surface electrodes penetrate the dielectric layer 180 and are taken to suitable external pins, not shown.

The device of FIG. 4 is also conventionally housed in a plastic housing 181 which overlies and contacts the upper surface of the completed chip as schematically shown in FIG. 4. Plastics used for the housing may be any suitable insulation material such as those sold under the tradenames Nitto MP-150SG, Nitto MP-180, and Hysol MG15-F.

Although the circuit coupled to $V_B$ and $V_s$ is shown in cross section in FIG. 4, a similar, separate construction would be used for circuit coupled between $V_{DD}$ and $V_{SS}$. Basically, the same structure would be used for the $V_{DD}$–$V_{SS}$ circuit, with the point marked $V_B$ in FIG. 4. Coupled to VDD and the point marked $V_S$ in FIG. 4 coupled to $V_{SS}$.

There has thus been provided a circuit for driving power transistors in a half bridge configuration from control signals referenced to any potential between the line voltage $V_L$ and its return $-V_L$. Preferably, the circuit is integrated on a single chip as an integrated circuit.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method for driving power transistors in a half bridge configuration from a control signal referenced to any potential between the line voltage for the power transistors and the line voltage return, comprising:

providing a control signal referenced to any potential between the line voltage and the line voltage return to an input circuit;

providing said input circuit with two voltage levels floating with respect to a common voltage level;

providing an output of said input circuit to a first level shifting circuit which shifts the level of the output of the input circuit so that it is referenced to the common voltage level;

providing said output referenced to the common voltage level to a low side driver circuit for the power transistor in said half bridge configuration which functions as a low side power transistor;

providing said output referenced to said common voltage level also to a second level shifting circuit which shifts the level of said output from said first level shifting circuit to produce a signal referenced to a second higher voltage level than said common level; and providing the signal referenced to said second higher voltage level to a high side driver circuit for driving the power transistor comprising the high side power transistor in said half bridge configuration.

2. The method recited in claim 1, wherein said two voltage levels floating with respect to a common voltage level are selected depending on the level of the line voltage and the return.

3. A circuit for driving power transistors in a half bridge configuration from a control signal referenced to any potential between the line voltage for the power transistors and the line voltage return, comprising:

an input circuit receiving a control signal referenced to any potential between the line voltage and the line voltage return, said input circuit being supplied with two voltage levels floating with respect to a common voltage level;

a first level shifting circuit receiving an output of said input circuit which shifts the level of the output of the input circuit so that it is referenced to the common voltage level;

a low side driver circuit for the power transistor in said half bridge configuration which functions as the low side power transistor, said low side driver circuit receiving said output referenced to the common voltage level;

a second level shifting circuit which shifts the level of said output from said first level shifting circuit to produce a signal referenced to a second higher voltage level than said common level; and a driver circuit receiving the signal referenced to said second higher voltage level for driving the power transistor comprising the high side power transistor in said half bridge configuration.

4. The circuit recited in claim 3, further comprising a reverse biased diode across said first level shifting circuit and a reverse biased diode across said second level shifting circuit, each of said diodes being able to withstand at least a potential of twice the line voltage.

5. The circuit recited in claim 3, wherein said two voltage levels floating with respect to a common voltage level are selected depending on the level of the line voltage and the return.

6. A method of integrating on a single integrated circuit chip a circuit for driving power transistors in a half bridge configuration from a control signal referenced to any potential between the line voltage for the power transistors and the line voltage return, comprising:

providing a control signal referenced to any potential between the line voltage and the line voltage return to an input circuit;

providing said input circuit with two voltage levels floating with respect to a common voltage level;

providing an output of said input circuit to a first level shifting circuit which shifts the level of the output of the input circuit so that it is referenced to the common voltage level;

providing said output referenced to the common voltage level to a low side driver circuit for the power transistor in said half bridge configuration which functions as a low side power transistor;

providing said output referenced to said common voltage level also to a second level shifting circuit which shifts the level of said output from said first level shifting circuit to produce a signal referenced to a second higher voltage level than said common level; and providing the signal referenced to said second higher voltage level to a high side driver circuit for driving the power transistor comprising the high side power transistor in said half bridge configuration.

7. The method recited in claim 6, wherein said two voltage levels floating with respect to a common voltage level are selected depending on the level of the line voltage and the return.

8. A circuit integrated on a single integrated circuit chip for driving power transistors in a half bridge configuration from a control signal referenced to any potential between the line voltage for the power transistors and the line voltage return, comprising:

an input circuit receiving a control signal referenced to any potential between the line voltage and the line voltage return, said input circuit being supplied with two voltage levels floating with respect to a common voltage level;

a first level shifting circuit receiving an output of said input circuit which shifts the level of the output of the input circuit so that it is referenced to the common voltage level;

a low side driver circuit for the power transistor in said half bridge configuration which functions as the low side power transistor, said low side driver circuit receiving said output referenced to the common voltage level;

a second level shifting circuit which shifts the level of said output from said first level shifting circuit to produce a signal referenced to a second higher voltage level than said common level; and a driver circuit receiving the signal referenced to said second higher voltage level for driving the power transistor comprising the high side power transistor in said half bridge configuration.

9. The circuit recited in claim 8, further comprising a reverse biased diode across said first level shifting circuit and a reverse biased diode across said second level shifting circuit, each of said diodes being able to withstand at least a potential of twice the line voltage.

10. The circuit recited in claim 8, wherein said two voltage levels floating with respect to a common voltage level are selected depending on the level of the line voltage and the return.

* * * * *